United States Patent [19]

Fiori, Jr.

[11] Patent Number: 4,709,224

[45] Date of Patent: Nov. 24, 1987

[54] DIGITAL-TO-ANALOG CONVERTER

[76] Inventor: David Fiori, Jr., 140 Dollington Rd., Yardley, Pa. 19067

[21] Appl. No.: 925,022

[22] Filed: Nov. 6, 1986

Related U.S. Application Data

[63] Continuation-in-part of Ser. No. 800,984, Nov. 22, 1985, abandoned.

[51] Int. Cl.[4] .............................................. H03M 1/82

[52] U.S. Cl. .......................... 340/347 DA; 324/79 R; 328/130.1; 340/347 NT; 340/347 M; 364/569

[58] Field of Search ................. 340/347 DA, 347 LC, 340/347 M, 347 C, 347 NT; 377/20; 328/127, 130.1; 364/569; 324/79 R

[56] References Cited

U.S. PATENT DOCUMENTS

| | | | |
|---|---|---|---|
| 4,236,110 | 11/1980 | Shearer et al. | 324/78 Z |
| 4,613,950 | 9/1986 | Knierim | 377/20 X |

*Primary Examiner*—T. J. Sloyan

*Attorney, Agent, or Firm*—Ratner & Prestia

[57] ABSTRACT

A digital-to-analog converter which develops an analog output representative of the difference between two digital inputs represented by the rates of two series of pulses. A prescribed number of pulses of each series is counted to develop two oppositely directed counter pulses, each having a duration dependent upon the time required to count the prescribed number of pulses. The counter pulses are integrated and the integration signal is sampled at the mid-point of each rise and decay. The average of the samples of each rise and decay represents the difference between the rates of the two series of input pulses.

21 Claims, 4 Drawing Figures

DIGITAL-TO-ANALOG CONVERTER

RELATED APPLICATION

The application is a continuation-in-part of application Ser. No. 800,984 filed Nov. 22, 1985, abandoned.

TECHNICAL FIELD

The present invention relates, in general, to digital-to-analog converters and, in particular, to a digital-to-analog converter which develops an analog output signal representative of the difference between two digital inputs represented by the rates of two series of pulses. Although the invention will be described in connection with sensor apparatus, such as is described, illustrated and claimed in copending application Ser. No. 700,081 filed on Feb. 11, 1985, it will be apparent that the invention has considerably broader application. For example, the invention can be adapted to demodulate a frequency-modulated signal.

BACKGROUND ART

There are many instances when analog output signals are developed by simple RC integrating circuits from pulses having durations representative of digital inputs. The aforementioned copending application, which provides one example, is directed to a non-contacting sensor apparatus in which the position of a moving part of the sensor is represented by the relative time durations of two output pulses of a counter. The two pulses are developed by first counting a prescribed number of pulses of a first series of input pulses representative of the resonance frequency of a first tank circuit which, in turn, represents the position of the moving part of the sensor relative to a first stationary inductance coil and then counting the same number of pulses of a second series of input pulses representative of the resonance frequency of a second tank circuit which, in turn, represents the position of the moving part of the sensor relative to a second stationary inductance coil. The relative times required to count the prescribed number of pulses define the time durations of the counter output pulses. An RC integrating circuit develops an analog output signal, representative of the position of the moving part of the sensor, from the counter output pulses.

The output signal of an RC integrating circuit is composed of a series of rising and decaying portions. In certain applications, such as when the time constant of the RC integrating circuit is relatively small, changes in an analog output signal are too large relative to the time over which the changes occur and produce undesirable or even unacceptable results. Meters and other display devices, arranged to faithfully indicate the average value of the parameter being measured or monitored, cannot respond to such changes in the signal produced by an RC integrating circuit to provide an accurate reading.

Consequently, it is preferable or even necessary to develop an analog output signal which represents or closely approximates the average of the signal developed by the RC integrating circuit.

One solution to the problem of large changes in the analog output signal is to increase the time constant of the RC integrating circuit to such an extent that the changes in the analog output signal are small and deviate little from the desired average value of this signal. However, large time constants slow down the response of the RC integrating circuit, so that quick changes in the parameter being displayed will not be indicated if they are too fast relative to the response time of the RC integrating circuit.

Faced with the requirement of small time constants for RC integrating circuits having quick response times, circuits have been developed in the past which selectively sample the analog output signal of an RC integrating circuit. By developing a signal from selected parts of the changing signal developed by the RC integrating circuit, the changes in the analog output signal are relatively small because the analog output signal is derived from limited changes in the signal developed by the RC integrating circuit.

Although such a sampling technique provides an improvement, the analog output signal still contains undesirable changes because the sampled signal is changing during sampling. Such changes in the analog output signal still introduce errors in the indication of the parameter being measured or monitored.

DISCLOSURE OF THE INVENTION

Accordingly, it is an objective of the present invention to provide a new and improved digital-to-analog converter.

It is another objective of the present invention to provide a digital-to-analog converter which is very accurate.

It is a further objective of the present invention to provide a digital-to-analog converter which is relatively simple in construction and inexpensive to fabricate.

These and other objectives are achieved by a digital-to-analog converter, constructed in accordance with the present invention, which includes input signal means for supplying a first series of input pulses having a repetition rate representative of a first digital input and a second series of input pulses having a repetition rate representative of a second digital input. Also included are counter means responsive to the input pulses for developing a counter signal composed of a first counter pulse having a duration representative of the time required to count a prescribed number of pulses of the first series and a second counter pulse, oppositely directed to the first counter pulse, having a duration representative of the time required to count the same number of pulses of the second series. This digital-to-analog converter further includes integrating means responsive to the counter signal for developing an integration signal composed of a rising portion developed from the first counter pulse and a decaying portion developed from the second counter pulse. The counter means are selectively connected to the integrating means by first switching means. Also included are a capacitor and second switching means for selectively connecting the integrating means to the capacitor. The first and second switching means are controlled by timing means which supply (a) a first control signal to the first switching means to disconnect the counter means from the integrating means and interrupt development of the integration signal, and (b) a second control signal to the second switching means to connect the integrating means to the capacitor to transfer the level of the integration signal to the capacitor during selected interruptions of the development of the integration signal.

BEST MODE OF CARRYING OUT THE INVENTION

Figure 1:
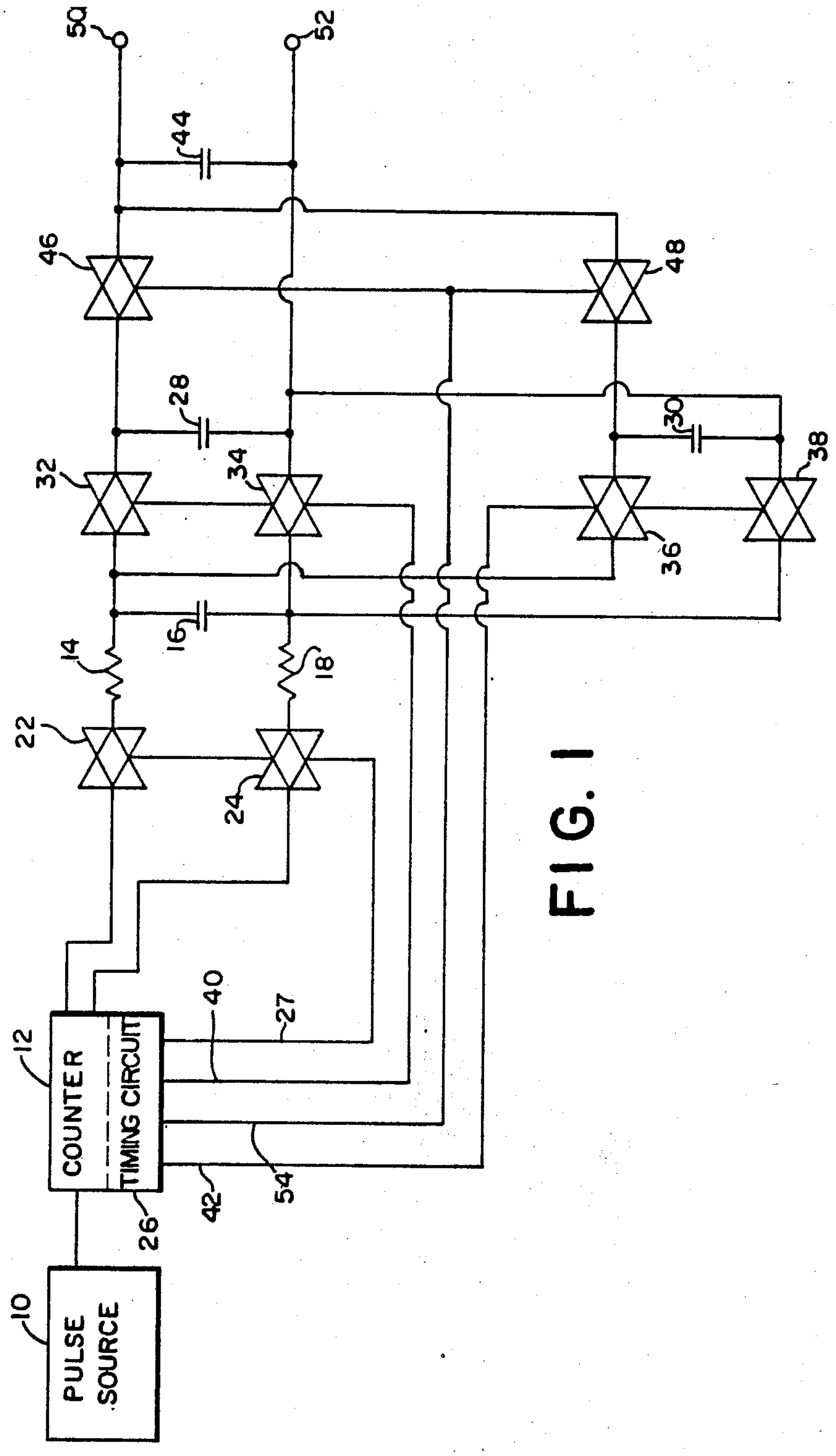
FIG. 1 is a circuit diagram of a first preferred embodiment of the present invention.
Figure 2:
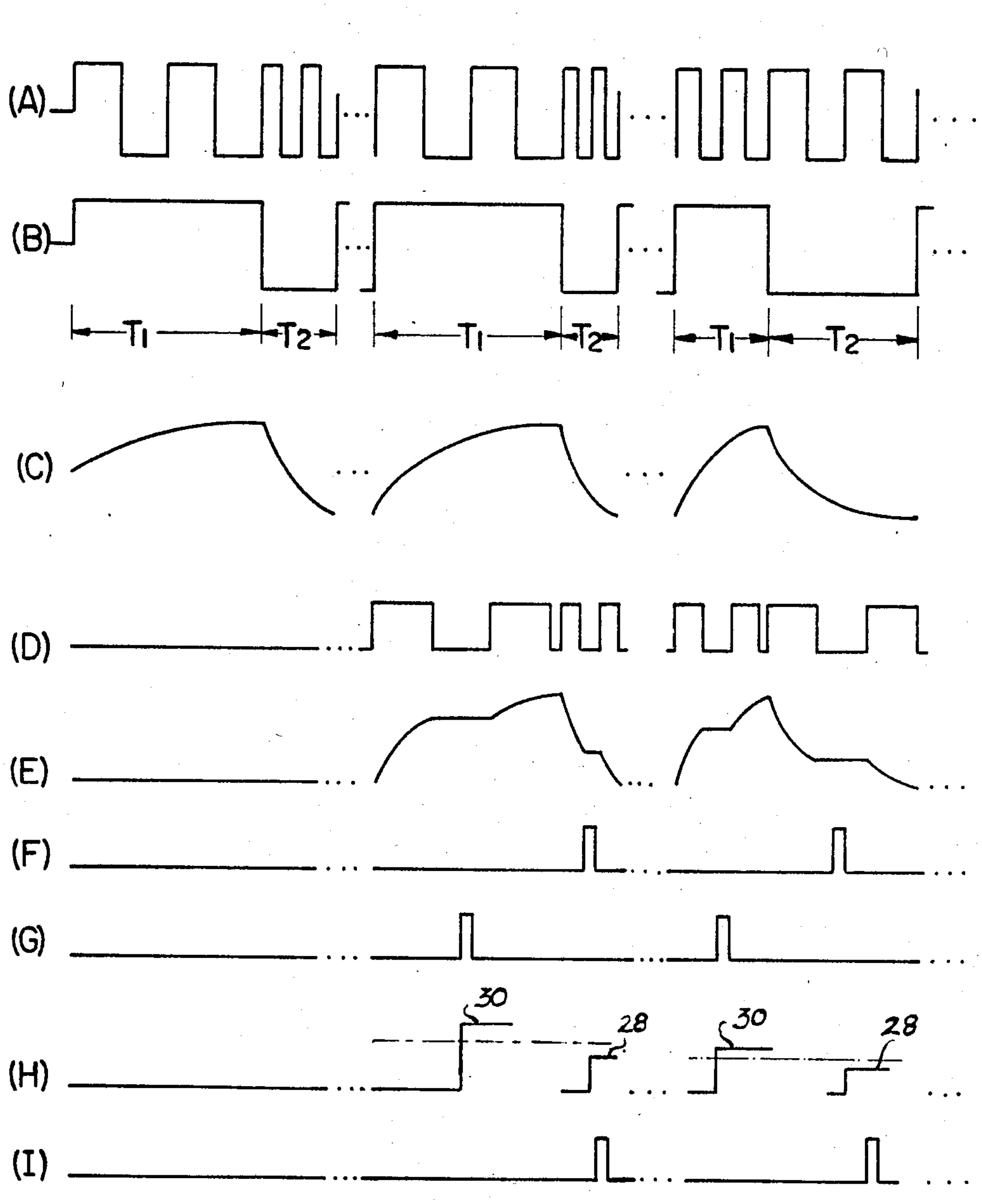
FIG. 2 is a series of waveform diagrams useful in understanding the operation of the FIG. 1 circuit.

Referring to FIGS. 1 and 2, a digital-to-analog converter, constructed in accordance with the present invention, includes input signal means for supplying a first series of input pulses having a repetition rate representative of a first digital input and a second series of input pulses having a repetition rate representative of a second digital input. The input signal means are represented in FIG. 1 by a pulse source 10 which supplies the pulses represented by waveform (A) in FIG. 2. The first series of input pulses is composed of the first set of four pulses, two positive-going and two negative-going, and the second series of input pulses is composed of the second set of four pulses, also two positive-going and two negative-going. The pulses of waveform (A) can be those derived by the sensor apparatus of the aforementioned copending application which is incorporated by reference as if fully disclosed in the present application. However, as stated previously, the present invention can be employed for other purposes. The difference in durations of the pulses of the first series of input pulses and the second series of input pulses results from the particulars of the sensor apparatus to which the copending application is directed. The present invention does not require that the two series of input pulses have different durations or that the durations of the pulses of one series be the same.

Counter means, represented in FIG. 1 by the counter portion 12 of a counter/timing circuit unit, are responsive to the pulses supplied by pulse source 10, and develop a counter signal, such as the one represented by waveform (B) of FIG. 2. The counter signal is composed of a first counter pulse having a duration representative of the time $T_1$ required to count a prescribed number of pulses of the first series of input pulses and a second counter pulse, oppositely directed to the first counter pulse, having a duration representative of the time $T_2$ required to count the same number of pulses of the second series of input pulses. With the start of each count, the output of counter 12 changes level and after the prescribed number of pulses have been counted, two positive-going and two negative-going for the example illustrated, a new count is started. The relative time durations $T_1$ and $T_2$ of the counter pulses provide an indication of the difference in the rates at which the two series of input pulses are supplied. This is illustrated by comparing the first two cycles in waveforms (A) and (B) with the third cycle.

The counter signal, represented by waveform (B), is supplied to integrating means which develop an integration signal, represented by waveform (C) in FIG. 2, composed of a rising portion developed during time $T_1$ from the positive-going first counter pulse and a decaying portion developed during time $T_2$ from the negative-going second counter pulse. In its simplest form, the integrating means include a resistor 14 and a capacitor 16. However, for the embodiment of the present invention illustrated in FIG. 1, the integrating means also include a second resistor 18 to which an inverted version of the counter signal is supplied. This arrangement provides a differential output across capacitor 16 from which the effects of environmental conditions, such as temperature variations, are cancelled.

As the counter signal is supplied to the integrating circuit composed of resistor 14 and capacitor 16, an integration signal, such as the one represented by waveform (C), is developed at the junction of resistor 14 and capacitor 16. As the inverted version of the counter signal is supplied to the integrating circuit composed of resistor 18 and capacitor 16, an integration signal, which is an inverted version of the one represented by waveform (C), is developed at the junction of resistor 18 and capacitor 16. The difference in the signals across capacitor 16 is proportional to:

$$\frac{T_1 - T_2}{T_1 + T_2}$$

Changes in the difference in the rates of the two series of input pulses cause changes in the relative values of $T_1$ and $T_2$. This, in turn, causes changes in the difference in the signals across capacitor 16. However, environmental conditions, which have the same effect on the rates of the two series of input pulses, are cancelled because those components of the integration signals resulting from such effects are equal and oppositely directed across capacitor 16. Although the present invention is illustrated in FIG. 1 as having a capacitor which is multiplexed between two resistors, two distinctly separate integrating circuits, each having a resistor and a capacitor, may be used. Also, in its broadest application, the present invention can include only one integrating circuit if cancellation of environmental conditions is not a concern.

Disposed between counter 12 and the integrating circuits are first switching means for selectively connecting the counter to the integrating circuits. Such switching means may include an electronic switch 22 which selectively couples the counter signal to the integrating circuit composed of resistor 14 and capacitor 16 and an electronic switch 24 which selectively couples the inverted version of the counter signal to the integrating circuit composed of resistor 18 and capacitor 16.

Switches 22 and 24 are controlled by the timing circuit portion 26 of the counter/timing circuit unit which supplies a first control signal along an output line 27 to switches 22 and 24 to disconnect counter 12 from the integrating circuit composed of resistor 14 and capacitor 16 and to disconnect counter 12 from the integrating circuit composed of resistor 18 and capacitor 16. The first control signal supplied by timing circuit 26 is represented by waveform (D) in FIG. 2 and is effective in interrupting development of the integration signals. Waveform (E) represents the effect of the first control signal from timing circuit 26 on the development of the integration signal developed at the junction of resistor 14 and capacitor 16. An identical signal, but oppositely directed to the one represented by waveform (E), is developed at the junction of resistor 18 and capacitor 16. So long as the first control signal is positive, switches 22 and 24 are closed and capacitor 16 functions in the usual way in charging and discharging according to the signals supplied by counter 12 and inverter 20.

When the level of the first control signal drops to zero, switches 22 and 24 open and the condition of capacitor 16 remains unchanged while the switches remain open. The levels of the integration signals remain at the levels at the start of the interruption. This is represented by the flat portions of waveform (E). When switches 22 and 24 are again closed by the control signal, capacitor 16 resumes charging and discharging according to the signals supplied by counter 12 and inverter 20.

The timing of the closing of switches 22 and 24 is selected at the mid-points of the rise and decay times of the integration signals to approximate the average levels of the integration signals. As will become apparent, the durations of the closing of switches 22 and 24 can be relatively short and shorter than illustrated in waveforms (D) and (E). However, timing circuit 26 is simplified by making the open time of switches 22 and 24 equal to the closed times which precede and follow the open times, thereby centering the interruptions of the development of the integration signal in the rising and decaying portions of the integration signal.

A pair of capacitors 28 and 30 serve to store the levels of the integration signals during periods of interruption in the development of the integration signals. Two such capacitors are provided in the FIG. 1 embodiment of the invention because of the differential arrangement of the integrating circuits. Only one such capacitor is required if only one integrating circuit is used.

Disposed between capacitors 28 and 30 and the integrating circuits are second switching means for selectively connecting the integrating circuits to these capacitors. Such switching means may include a pair of electronic switches 32 and 34 which selectively transfer the level of the integration signals to capacitor 28 during selected interruptions of the development of the integration signals and a pair of electronic switches 36 and 38 which selectively transfer the level of the integration signals to capacitor 30 during selected interruptions of the development of the integration signals.

Switches 32, 34, 36 and 38 also are controlled by timing circuit 26 which supplies second control signals along a pair of output lines 40 and 42 to switches 32 and 34 to connect capacitor 28 to capacitor 16 and to switches 36 and 38 to connect capacitor 30 to capacitor 16. The second control signal supplied by timing circuit 26 along output line 40 is represented by waveform (F) in FIG. 2. This signal is composed of pulses which are present during selected open times of switches 22 and 24 during the decay portions of the integration signal and sample the level of the integration signal during these periods of interruption of the development of the integration signal. In this way, the control signal supplied to switches 32 and 34 is effective in transferring the level of the integration signal, as shown by the second flat portion of each cycle of waveform (E), to capacitor 28.

A similar control signal, represented by waveform (G) in FIG. 2, is supplied by timing circuit 26 along line 42 to switches 36 and 38. This signal is composed of pulses which are present during selected open times of switches 22 and 24 during the rise portions of the integration signal and sample the level of the integration signal during these periods of interruption of the development of the integration signal. In this way, the control signal supplied to switches 36 and 38 is effective in transferring the level of the integration signal, as shown by the first flat portion of each cycle of waveform (E), to capacitor 30.

Waveform (H) in FIG. 2 represents the levels of the integration signals transferred to capacitors 28 and 30. Those portions of waveform (H) identified by reference numeral 28 correspond to the signal developed across capacitor 28, while those portions of waveform (H) identified by reference numeral 30 correspond to the signal developed across capacitor 30. It will be understood that this result is produced whether the integrating means include only one integration circuit or two integration circuits arranged to develop a differential signal. The only difference between the two is the magnitude of the signals.

Capacitors 28 and 30 are connected to another capacitor 44 through third switching means comprising a pair of electronic switches 46 and 48. Capacitor 44 serves to develop an output signal between an output terminal 50 and a reference terminal 52 which is the average of the two signals developed across capacitors 28 and 30. This output signal is represented by the dot-dash lines in waveform (H) and is developed by closing switches 46 and 48 which are controlled by a third control signal also supplied from timing circuit 26 along an output line 54. This control signal, represented by waveform (I) in FIG. 2, can occur at any time after the development of two consecutive flat portions of waveform (E) and before development of the next flat portion.

One or the other of the integration signals is selected as a reference and changes in the other integration signal, relative to changes in the reference signal, provide an analog output signal which very closely approximates the average of the difference in the two integration signals. As shown by the second and third cycles of the waveforms in FIG. 2, when the relative durations of $T_1$ and $T_2$ change, the average level changes. This is shown in waveform (H).

It should be noted that only two switches 46 and 48 rather than four are required to transfer the signals from capacitors 28 and 30 to capacitor 44 even though there are four lines from switches 32, 34, 36 and 38 to capacitors 28 and 30. This savings of two switches is possible because the output sides of switches 34 and 38 can be connected together as the reference terminal 52.

Figure 1A:
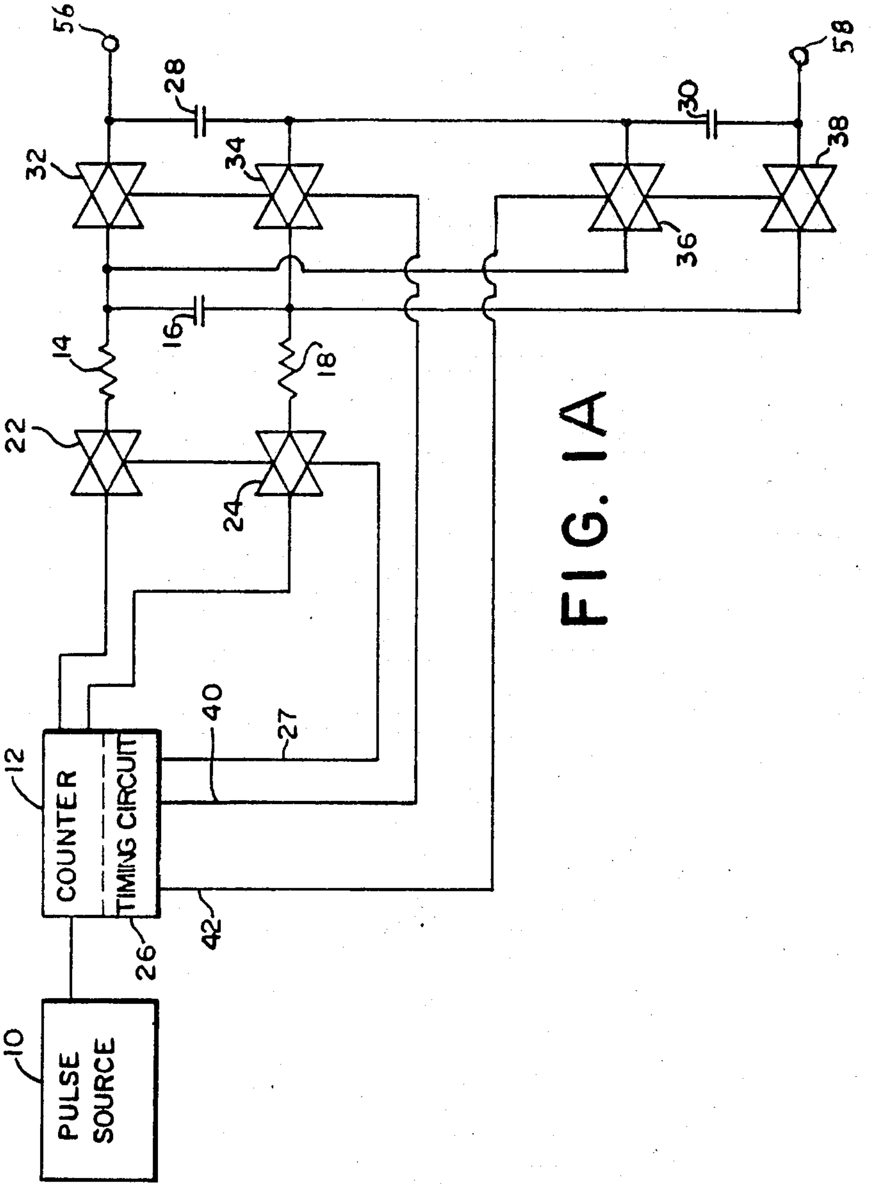
FIG. 1A is a circuit diagram of a second preferred embodiment of the present invention.

FIG. 1A shows a modification to the FIG. 1 embodiment of the invention which simplifies the circuitry and produces larger output signals. The embodiment of the invention shown in FIG. 1A eliminates electronic switches 46 and 48, capacitor 44, and the need for the third control signal supplied along output line 54 from timing circuit 26. By connecting capacitors 28 and 30 in series as shown in FIG. 1A, an output signal is developed between a pair of terminals 56 and 58 which is twice as large as the output signal developed between terminals 50 and 52 in FIG. 1.

An examination of waveform (H) indicates that each of the two flat portions of the interrupted integration signal approximates the average of the two. This results from interrupting the development of the integration signal at the mid-points of the rise and decay times of the integration signal. Consequently, in certain applications, when a certain degree of accuracy can be sacrificed, only one of the two interruptions in the development of the integration signal needs to be sampled. Under such circumstances switches 36, 38, 46, and 48 and capacitors 30 and 44 can be eliminated from the FIG. 1 circuit.

Figure 3:
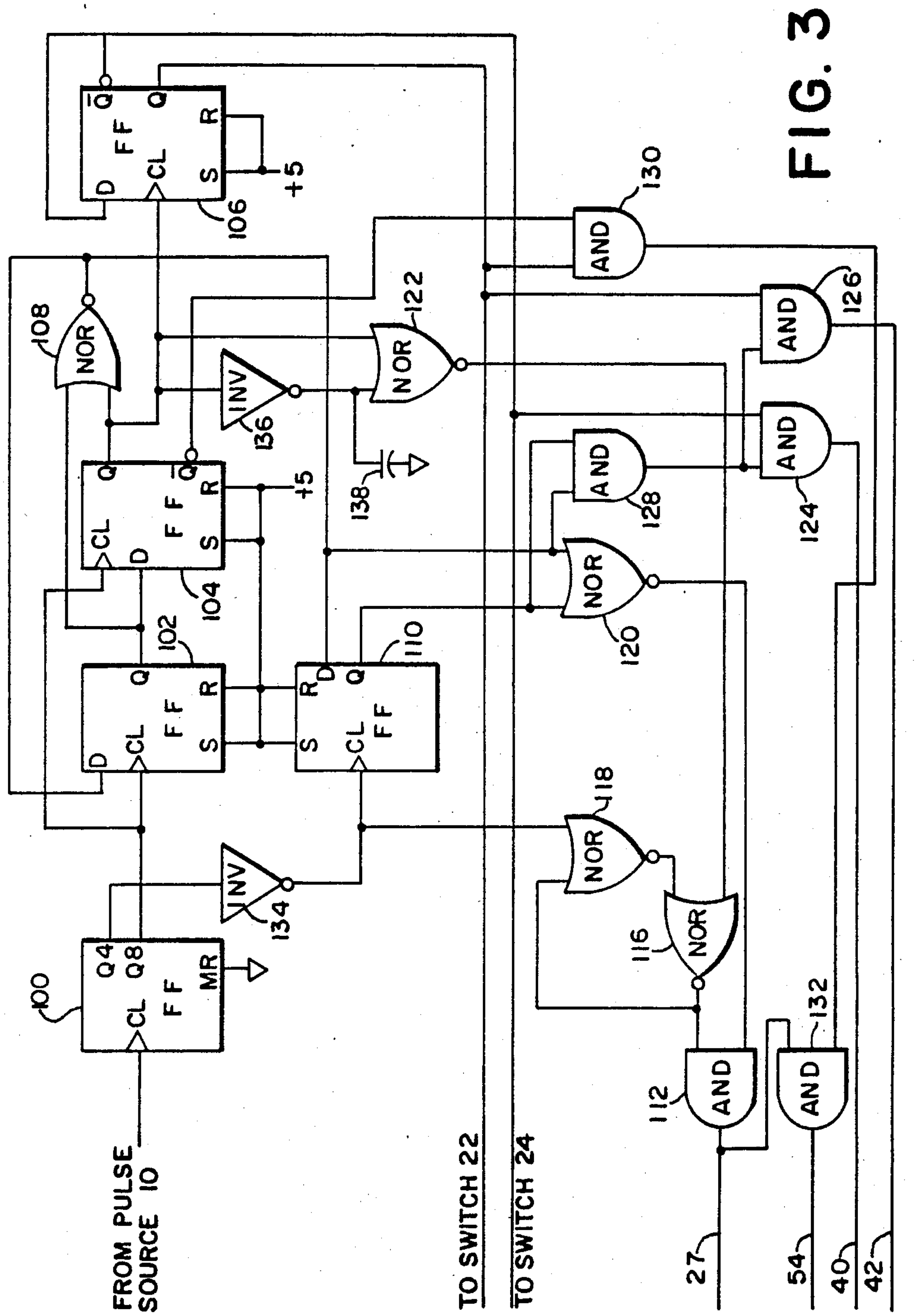
FIG. 3 is a circuit diagram of a preferred embodiment of the counter/timing circuit unit of FIG. 1.

FIG. 3 shows the details of a preferred embodiment of the counter/timing circuit unit of FIG. 1. Because each of the components is identified below by its commercial part number designation and interconnections between components are indicated in FIG. 3, only a brief description of the operation of this counter/timing circuit unit is necessary.

The first and second series of input pulses supplied from pulse source 10 and represented by waveform (A) of FIG. 1 are received by the counter portion which includes four D-type flip-flops 100, 102, 104 and 106 and a NOR gate 108. The outputs of flip-flop 106 are the counter signal, represented by wave-form (B) of FIG. 2, and the inverted version of the counter signal. These two signals are supplied to switches 22 and 24, respectively.

The counter portion, in conjunction with a D-type flip-flop 110, an AND gate 112 and four NOR gates 116, 118, 120 and 122, develops the first control signal, represented by waveform (D) of FIG. 2, which controls switches 22 and 24 to interrupt the development of the integration signals. The logic of the counter/timing circuit unit is effective in producing, at the output of AND gate 112, a signal which closes switches 22 and 24 for the first one-third of the duration of the counter pulses, opens these switches during the middle one-third of the duration of the counter pulses, closes these switches for the last one-third of the duration of the counter pulses and opens these switches for a relatively brief period at the start of each integration cycle.

The duration of each part of the first control signal is determined by the time required to count a prescribed number of pulses supplied from pulse source 10 and, therefore, dependent upon the rates of the first and second series of input pulses. As an example, the three segments of the first control signal which control the development of the integration signals each may require a count of 512 pulses and the period between integration cycles may require a count of 128 pulses. By developing the first control signal from two series of input pulses, the first control signal is synchronized with the counter signal.

The second control signals, represented by waveforms (F) and (G) of FIG. 2, which control switches 32, 34, and 36, 38, respectively, to sample the integration signals are developed by the counter portion and four AND gates 124, 126, 128 and 130. The logic of the counter/timing circuit unit is effective in producing the sampling pulses during periods of interruption of the development of the integration signals and selecting the duration of the sampling pulses to be less than these periods of interruption. In this way, switching transistors in switches 22 and 24 are turned off prior to the connection of capacitor 16 to capacitors 28 and 30.

An AND gate 132 controls switches 46 and 48 to average the two signals developed across capacitors 28 and 30.

The following components may be used in the FIG. 3 embodiment of the counter/timing circuit unit:pa

| | |
|---|---|
| Flip Flop 100 | 74HC4040 |
| Flip Flop 102 | 74HC74 |
| Flip Flop 104 | 74HC74 |
| Flip Flop 106 | 74HC74 |
| NOR 108 | 74HC02 |
| Flip Flop 110 | 74HC74 |
| AND 112 | 74HC08 |
| NOR 116 | 74HC02 |
| NOR 118 | 74HC02 |
| NOR 120 | 74HC02 |
| NOR 122 | 74HC02 |
| AND 124 | 74HC08 |
| AND 126 | 74HC08 |
| AND 130 | 74HC08 |
| AND 132 | 74HC08 |
| INV. 134 | 74HC14 |
| INV. 136 | 74HC04 |
| Capacitor 138 | 470uf |

The foregoing has set forth exemplary and preferred embodiments of the present invention. It will be understood, however, that various alternatives will occur to those of ordinary skill in the art without departure from the spirit or scope of the present invention.

What is claimed:

1. A digital-to-analog converter for developing an analog output representative of the difference between two digital inputs, said converter comprising:

input signal means for supplying a first series of input pulses having a repetition rate representative of a first digital input and a second series of input pulses having a repetition rate representative of a second digital input;

counter means responsive to said input pulses for developing a counter signal composed of a first counter pulse having a duration representative of the time required to count a prescribed number of pulses of said first series and a second counter pulse, oppositely directed to said first counter pulse, having a duration representative of the time required to count the same number of pulses of said second series;

integrating means responsive to said counter signal for developing an integration signal composed of a rising portion developed from said first counter pulse and a decaying portion developed from said second counter pulse;

first switching means for selectively connecting said counter means to said integrating means;

a capacitor;

second switching means for selectively connecting said integrating means to said capacitor;

and timing means for supplying (a) a first control signal to said first switching means to disconnect said counter means from said integrating means and interrupt development of said integration signal, and (b) a second control signal to said second switching means to connect said integrating means to said capacitor to transfer the level of said integration signal to said capacitor during selected interruptions of the development of said integration signal.

2. A digital-to-analog converter according to claim 1 wherein the development of said integration signal is interrupted at the mid-points of said rising and decaying portions.

3. A digital-to-analog converter according to claim 2 wherein the duration of interruption of the development of said integration signal during said rising portion is one-third of the duration of said first counter pulse and the duration of interruption of the development of said integration signal during said decaying portion is one-third of the duration of said second counter pulse.

4. A digital-to-analog converter according to claim 3 wherein said interruptions of the development of said integration signal are centered in said rising and decaying portions.

5. A digital-to-analog converter according to claim 2 wherein said timing means are responsive to said counter means and said first control signal is synchronized with said counter signal.

6. A digital-to-analog converter according to claim 5 wherein said timing means include means for:

(a) raising the level of said first control signal until one-third of said prescribed number of input pulses of said first series are counted, then (b) dropping the level of said first control signal until one-third of said prescribed number of input pulses of said first series are counted, then (c) raising the level of said first control signal until one-third of said prescribed number of input pulses of said first series are counted, then (d) dropping the level of said first control signal until a second prescribed number of input pulses of said second series are counted, then (e) raising the level of said first control signal until one-third of said prescribed number of input pulses of said second series are counted, then (f) dropping the level of said first control signal until one-third of said prescribed number of input pulses of said second series are counted, then (g) raising the level of said first control signal until one-third of said prescribed number of input pulses of said second series are counted, and then (h) dropping the level of said first control signal until said second prescribed number of input pulses of said first series are counted.

7. A digital-to-analog converter according to claim 2 wherein said integration signal is transferred to said capacitor during at least one of the interruptions of the development of said integration signal.

8. A digital-to-analog converter according to claim 7 wherein the duration of the transfer of said integration signal to said capacitor is less than the duration of the interruption of the development of said integration signal.

9. A digital-to-analog converter according to claim 8 further including a second capacitor and wherein said timing means supply two second control signals and said second switching means include two switches each separately controlled by one of said second control signals to separately transfer the level of said integration signal to one of said capacitors during interruptions of the development of said rising portions of said integration signal and to the other of said capacitors during interruptions of the development of said decaying portions of said integration signal.

10. A digital-to-analog converter according to claim 9 further including a third capacitor and third switching means for selectively connecting the first two capacitors to said third capacitor and wherein said timing circuit supplies a third control signal to said third switching means to connect said first two capacitors to said third capacitor to transfer the signals across said first two capacitors to said third capacitor.

11. A digital-to-analog converter according to claim 10 wherein said signals across said first two capacitors are transferred to said third capacitor after two consecutive interruptions of the development of said integration signal and before the next interruption of the development of said integration signal.

12. A digital-to-analog converter for developing an analog output representative of the difference between two digital inputs, said converter comprising:

input signal means for supplying a first series of input pulses having a repetition rate representative of a first digital input and a second series of input pulses having a repetition rate representative of a second digital input;

counter means responsive to said input pulses for developing (a) a first counter signal composed of a first counter pulse having a duration representative of the time required to count a prescribed number of pulses of said first series and a second counter pulse, oppositely directed to said first counter pulse, having a duration representative of the time required to count the same number of pulses of said second series, and (b) a second counter signal which is an inverted version of said first counter signal;

integrating means responsive to said first and said second counter signals for developing (a) a first integration signal composed of a rising portion developed from said first counter pulse of said first counter signal and a decaying portion developed from said second counter pulse of said first counter signal, and (b) a second integration signal composed of a decaying portion developed from said first counter pulse of said second counter signal and a rising portion developed from said second counter pulse of said second counter signal;

first switching means for selectively connecting said counter means to said integrating means;

a first capacitor;

a second capacitor;

second switching means for selectively connecting said integrating means to said first and said second capacitors;

and timing means for supplying (a) a first control signal to said first switching means to disconnect said counter means from said integrating means and interrupt development of said integration signals, and (b) a pair of second control signals to said second switching means to connect said integrating means to said first and said second capacitors to transfer the level of said first and said second integration signals to said first capacitor during selected interruptions of the development of said first and said second integration signals and to transfer the level of said first and said second integration signals to said second capacitor during selected interruptions of the development of said first and said second integration signals.

13. A digital-to-analog converter according to claim 12 wherein the development of said integration signals is interrupted at the mid-points of said rising and decaying portions.

14. A digital-to-analog converter according to claim 13 wherein the duration of interruption of the development of said integration signals during said rising portions of said first integration signal is one-third of the duration of said first counter pulse of said first counter signal, the duration of interruption of the development of said integration signals during said decaying portions of said first integration signal is one-third of the duration of said second counter pulse of said first counter signal, the duration of interruption of the development of said integration signals during said decaying portions of said second integration signal is one-third of the duration of said first counter pulse of said second counter signal, and the duration of interruption of the development of said integration signals during said rising portions of said second integration signal is one-third of the duration of said second counter pulse of said second counter signal.

15. A digital-to-analog converter according to claim 14 wherein said interruptions of the development of said integration signals are centered in said rising and decaying portions.

16. A digital-to-analog converter according to claim 13 wherein said timing means are responsive to said counter means and said first control signal is synchronized with said counter signals.

17. A digital-to-analog converter according to claim 16 wherein said timing means include means for:

(a) raising the level of said first control signal until one-third of said prescribed number of input pulses of said first series are counted, then (b) dropping the level of said first control signal until one-third of said prescribed number of input pulses of said first series are counted, then (c) raising the level of said first control signal until one-third of said prescribed number of input pulses of said first series are counted, then (d) dropping the level of said first control signal until a second prescribed number of input pulses of said second series are counted, then (e) raising the level of said first control signal until one-third of said prescribed number of input pulses of said second series are counted, then (f) dropping the level of said first control signal until one-third of said prescribed number of input pulses of said second series are counted, then (g) raising the level of said first control signal until one-third of said prescribed number of input pulses of said second series are counted, and then (h) dropping the level of said first control signal until said second prescribed number of input pulses of said first series are counted.

18. A digital-to-analog converter according to claim 13 wherein said first integration signal is transferred to said first capacitor during at least one of the interruptions of the development of said first integration signal and said second integration signal is transferred to said second capacitor during at least one of the interruptions of the development of said second integration signal.

19. A digital-to-analog converter according to claim 18 wherein the duration of the transfer of said integration signals to said capacitors is less than the duration of the interruption of the development of said integration signals.

20. A digital-to-analog converter according to claim 19 further including a third capacitor and third switching means for selectively connecting said first and said second capacitors to said third capacitor and wherein said timing circuit supplies a third control signal to said third switching means to connect said first and said second capacitors to said third capacitor to transfer the signals across said first and said second capacitors to said third capacitor.

21. A digital-to-analog converter according to claim 20 wherein said signals across said first and said second capacitors are transferred to said third capacitor after two consecutive interruptions of the development of said integration signals and before the next interruption of the development of said integration signals.

* * * * *